United States Patent
van Gorsel et al.

(10) Patent No.: US 10,042,119 B2
(45) Date of Patent: Aug. 7, 2018

(54) CASCADE OPTICAL BEAM SPLITTER

(71) Applicant: ChiSquare Bioimaging LLC, Brookline, MA (US)

(72) Inventors: Hendrik van Gorsel, Brookline, MA (US); Loling Song, Brookline, MA (US)

( * ) Notice: Subject to any disclaimer, the term of this patent is extended or adjusted under 35 U.S.C. 154(b) by 0 days.

(21) Appl. No.: 15/619,482

(22) Filed: Jun. 10, 2017

(65) Prior Publication Data

US 2017/0357056 A1    Dec. 14, 2017

Related U.S. Application Data

(60) Provisional application No. 62/348,772, filed on Jun. 10, 2016.

(51) Int. Cl.
| | |
|---|---|
| *G02B 6/28* | (2006.01) |
| *G02B 27/14* | (2006.01) |
| *G02B 6/293* | (2006.01) |
| *G02B 27/28* | (2006.01) |

(52) U.S. Cl.
CPC ....... *G02B 6/2938* (2013.01); *G02B 6/29302* (2013.01); *G02B 27/141* (2013.01); *G02B 27/283* (2013.01)

(58) Field of Classification Search
None
See application file for complete search history.

(56) References Cited

U.S. PATENT DOCUMENTS

| | | | | |
|---|---|---|---|---|
| 6,031,952 | A * | 2/2000 | Lee ................. | G02B 6/2817 385/24 |
| 8,750,702 | B1 * | 6/2014 | Figueira .............. | H04B 10/00 398/16 |
| 9,703,044 | B2 * | 7/2017 | Hong ................. | G02B 6/2938 |
| 9,720,243 | B1 * | 8/2017 | Belt ................... | G02B 27/145 |
| 9,791,705 | B1 * | 10/2017 | Mitchell ............. | G02B 27/1066 |
| 2002/0181046 | A1 * | 12/2002 | Jeong ................. | G02B 6/29362 398/79 |
| 2008/0212191 | A1 * | 9/2008 | Harle ................. | G02B 27/1006 359/618 |
| 2011/0292343 | A1 * | 12/2011 | Papac ................. | A61B 3/0008 351/221 |

(Continued)

*Primary Examiner* — Jerry Rahll
(74) *Attorney, Agent, or Firm* — Patent GC; Alexander Franco

(57) ABSTRACT

An optical beam splitter is presented whereby more than one incoming substantially collimated beam of light is combined into a common light path and subsequently the combined beam is divided into multiple outgoing beams of light. Another configuration of the cascade beam splitter is whereby a single incoming beam of substantially collimated light is divided, in a cascade, into multiple outgoing beams of light of lower power. A cascade beam splitter can be used to divide a single incoming substantially collimated beam of light into multiple outgoing beams of light. The connectors at which light enters or exits the beam splitter device can be made to allow free-space substantially collimated light propagation and can include optical and optomechanical elements for the purpose of collimating the incoming beam(s) or aligning and focusing the outgoing beams onto the core of a single mode or a multimode fiber.

7 Claims, 2 Drawing Sheets

(56) References Cited

U.S. PATENT DOCUMENTS

| | | | |
|---|---|---|---|
| 2012/0001083 A1* | 1/2012 | Knapp | G01J 3/02 250/370.12 |
| 2013/0335797 A1* | 12/2013 | Cooper | G02B 21/16 359/199.2 |
| 2015/0048147 A1* | 2/2015 | Ide | H01S 5/02248 228/175 |
| 2017/0082803 A1* | 3/2017 | Hong | G02B 27/0012 |

\* cited by examiner

CASCADE OPTICAL BEAM SPLITTER

RELATED APPLICATIONS

The subject matter of this application is related to U.S. Provisional Application No. 62/348,772, filed on Jun. 10, 2016, which is incorporated herein by reference in its entirety.

SUMMARY

A single substantially collimated beam of light is split into cascading substantially collimated beams. The splitting can be preceded by merging light from two or more sources into this single substantially collimated beam.

In accordance with one embodiment, a laser beam splitter device includes: a plurality of m input couplers, where m is at least two; a sequence of m−1 beam combiners arranged such that a first incoming substantially collimated beam to any combiner in the sequence, except a first combiner, is received from a prior combiner in the sequence and such that the first incoming substantially collimated beam to the first combiner in the sequence is received from a first of the plurality of m input couplers, the combiners further arranged such that a second incoming beam to each combiner in the sequence is received respectively and individually from one of the second through mth input couplers; a sequence of n−1 beam splitters, where n is at least two, arranged such that an incoming substantially collimated beam to each splitter in the sequence, except a first splitter, is received from a prior splitter in the sequence and such that an incoming substantially collimated beam to the first splitter in the sequence is received from a last of the sequence of beam combiners; and a set of n output couplers, each output coupler configured to receive a beam from one of the sequence of n−1 splitters. In one aspect, at least one of the input couplers or at least one of the output couplers is optically connected to an optical fiber. In one aspect, each of the beam combiners is a dichroic mirror. In one aspect, one of the beam combiners is a polarizing beam splitter. In one aspect, at least one of the beam combiners is a dichroic mirror. In one aspect, n is at least three, and wherein each splitter has a respective splitting ratio, with a last splitter in the sequence having a splitting ratio of substantially 1/2 and each successive prior splitter in the sequence having a decreasing splitting ratio determined substantially by successively increasing, by integer increments, a denominator in the splitting ratio starting from 1/2, for each successive splitter, until the first splitter in the sequence has a splitting ratio of 1/n. In one aspect, n is at least three, and wherein each splitter has a respective splitting ratio, with a last splitter in the sequence having a splitting ratio of substantially 1/2 and each successive prior splitter in the sequence having a decreasing splitting ratio determined substantially by successively increasing, by integer increments, a denominator in the splitting ratio starting from 1/2, for each successive splitter, until the first splitter in the sequence has a splitting ratio of 1/n. In one aspect, n is at least three. In one aspect, m is two and n is two.

In accordance with one embodiment, a laser beam splitter device includes: an input coupler; a sequence of n−1 beam splitters, where n is at least three, the sequence of beam splitters arranged such that an input beam to each splitter in the sequence, except a first splitter, is received from a prior splitter in the sequence and such that an input beam to the first splitter in the sequence is received from the input coupler, wherein each splitter has a respective splitting ratio, with a last splitter in the sequence having a splitting ratio of substantially 1/2 and each successive prior splitter in the sequence having a decreasing splitting ratio determined substantially by successively increasing, by integer increments, a denominator in the splitting ratio starting from 1/2, for each successive splitter, until the first splitter in the sequence has a splitting ratio of 1/n; and a set of n output couplers each output coupler configured to receive a beam from one of the sequence of n−1 splitters. In one aspect, each of the input coupler and the n output couplers is optically connected to a single mode optical fiber.

DETAILED DESCRIPTION

In the following description, references are made to various embodiments in accordance with which the disclosed subject matter can be practiced. Multiple references to "one embodiment" or "an embodiment" do not necessarily refer to the same embodiment. Particular features, structures or characteristics associated with such embodiments can be combined in any suitable manner in various embodiments.

An optical device, referred to herein as a cascade beam splitter, splits a single beam of substantially collimated light, such as a laser beam, into three or more equal or non-equal light beams.

Figure 1:
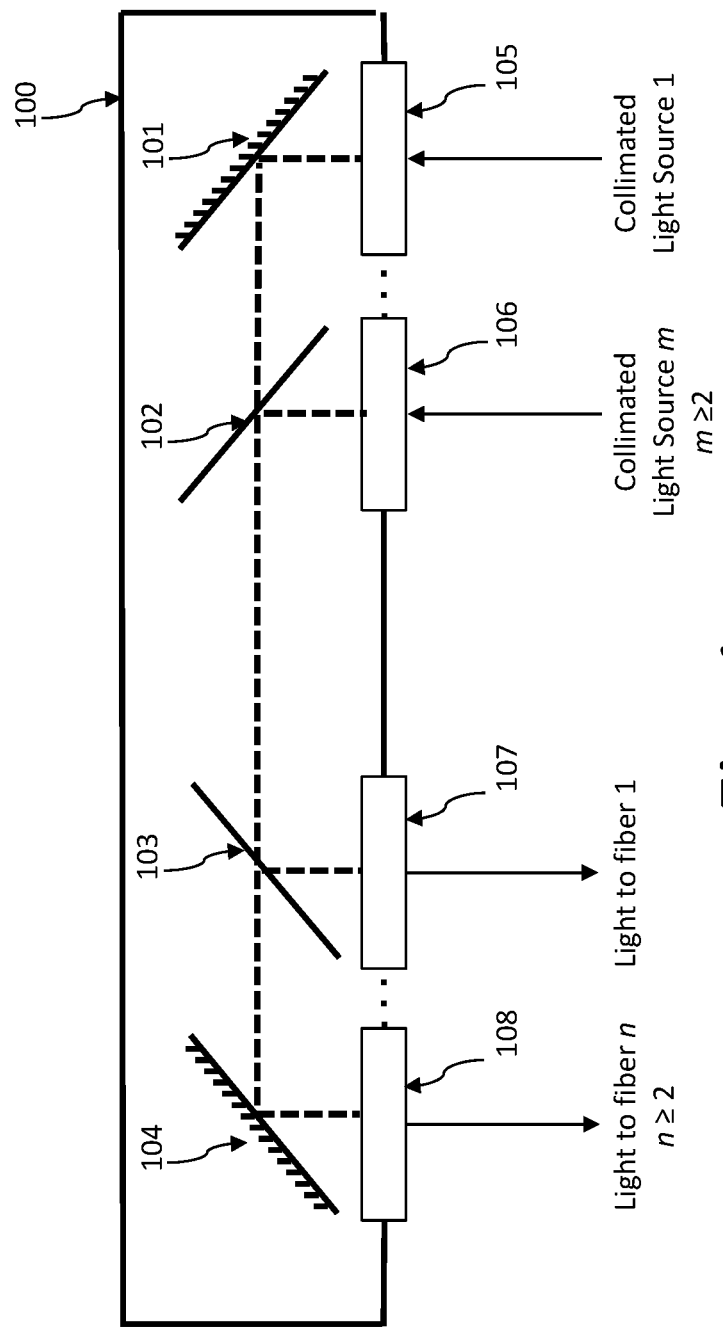
FIG. 1 illustrates a substantially collimated light beam splitter dividing two or more incoming light beams into multiple outgoing beams of light in accordance with one embodiment.

FIG. 1 illustrates a cascade beam splitter dividing two or more incoming light beams from different light sources into multiple outgoing beams of light of lower power in accordance with one embodiment. Two or more substantially collimated light beams, at least one of which is a laser beam, of different characteristics (such as wavelengths, polarization, or temporal profile) are delivered, optionally by optical fibers, such as single mode fibers, through coupler 105, 106 into one or more beam combiners 102. Each connector 105 and 106 can be optionally configured to collimate the incoming beams of light, if the light is not already collimated. Each beam combiner 102 can be a dichroic mirror or polarizing beam splitter acting as a beam combiner for light with different polarizations. The input beam can be redirected by one or more optional mirrors 101 before or after being combined. The combined beam is then sub-divided into two or more beams of lower power through one or more beam splitters 103 as discussed above with reference to FIG. 1. In one embodiment, the resultant beams of lower power are then focused by the optional optics inside the coupler 107, 108 onto the core of a single mode fiber.

In various embodiments, a splitter can be configured to combine and split substantially collimated beams from multiple pulsed lasers, beams of multiple continuous wave lasers, or beams from both pulsed and continuous wave lasers, or substantially collimated beams from laser and non-laser light sources, beams of different optical properties from the same light source.

In various embodiments, in order to achieve the desired splitting ratios, polarizing or non-polarizing beam splitters can be appropriately selected.

In one application example, multiple laser beams of different wavelengths, with each beam being pulsed or continuous, can be combined and the combined beam can be split with the resulting split beams being transported in single mode through single mode fibers.

In one embodiment, the power of a single incoming beam of light is divided into three or more beams of equal or unequal lower power with the same or different polarization characteristics.

In one embodiment, multiple incoming beams of light sources are combined and the combined beams are divided into three or more beams of equal or unequal lower power with the same or different wavelengths and polarization characteristics.

Figure 2:
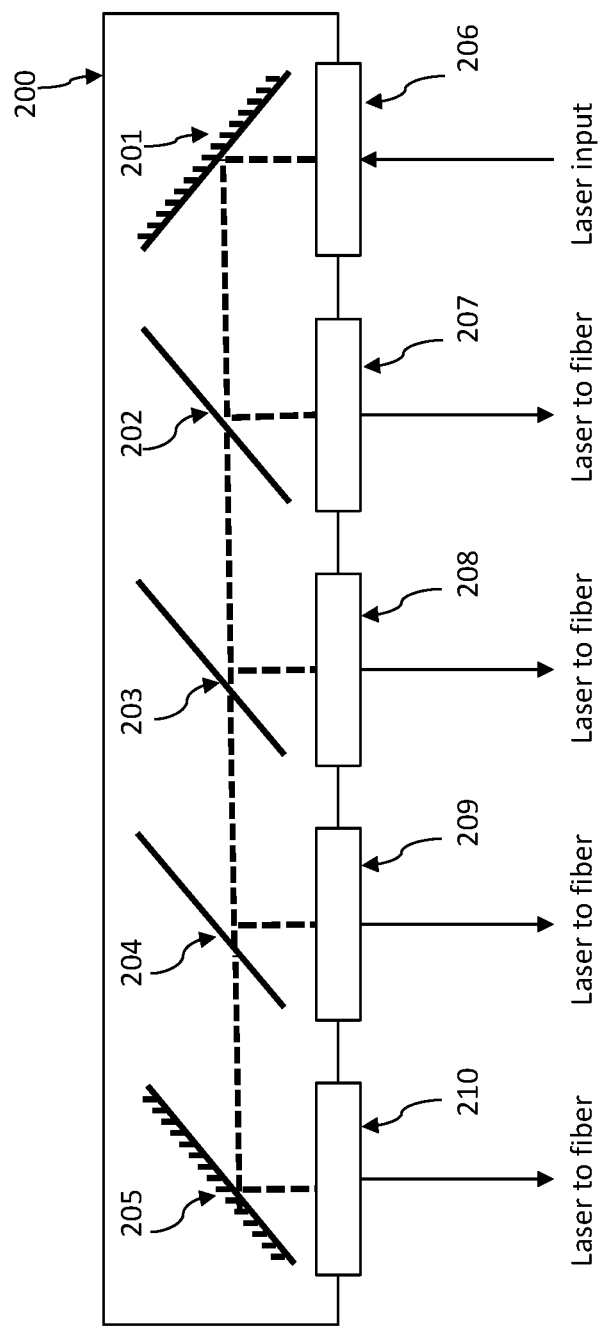
FIG. 2 illustrates a substantially collimated light beam splitter dividing a single incoming beam of light into multiple outgoing beams of light in accordance with one embodiment.

FIG. 2 illustrates a cascade beam splitter 200 dividing a single incoming beam of pulsed laser light into multiple outgoing beams of light of lower power in accordance with one embodiment. A laser beam enters the cascade beam splitter through a connector assembly (or coupler) 206, which has optical elements to collimate the laser beam. In one embodiment, the connector assembly (or coupler) 206 can be optionally configured to receive the laser beam from an optical fiber, such as a single mode fiber. The input beam from the connector assembly (or coupler) 206 can be optionally redirected by one or more optional mirrors 201 in its path through the cascade beam splitter. The optional mirrors 201 and 205 are for the purpose of directing the laser input and laser output, respectively, in the same physical orientation as the other inputs and outputs. The substantially collimated incoming beam passes through and is divided by a series of beam splitters, 202, 203, and 204, into three or more individual substantially collimated outgoing beams of equal or non-equal power. The incoming light beam can be divided into an arbitrary number of outgoing light beams using a series of an arbitrary number of beam splitters. The pass through of the last beam splitter 204 can be redirected by another optional mirror 205. Each individual resultant beam can be focused by optics in a connector assembly (or coupler) 207, 208, 209 and 210 to the core of a single mode or multimode fiber.

In order to split an incoming light beam into n beams of equal power, n−1 beam splitters can be arranged in series, with appropriately configured splitting ratios. For example, referring to FIG. 2, to split the incoming beam of light into four equal (and lower) powered beams, the splitters 202, 203 and 204 can be configured with ratios of 1/4, 1/3 and 1/2 respectively, in which the ratio represents the reflected and (1-ratio) represents the transmitted portion of the light power. For any desired number n of equal-powered split beams to be produced, the n−1 splitters can be configured with incrementally decreasing ratios starting at 1/2 for the last (n−1)th splitter, and increasing the denominator by 1 for each successive prior splitter in the sequence to the first as follows: 1/2, 1/3, 1/4, 1/5, 1/6, and so on until the first splitter has the ratio 1/n. The 1/n ratio splitter is positioned first in the beam path and the 1/2 ratio splitter is positioned last in order to produce n substantially equal powered split beams.

In one embodiment, the power of a single incoming pulsed laser source is divided into three or more beams of equal or unequal lower power of the same or different polarization characteristics. Each of the lower power beams can be focused and aligned, by additional optical elements, onto the core of a single mode fiber to deliver pulses in single mode or onto the core of a multimode fiber.

In one embodiment, in order to create substantially equal powered beams, the ratios of some of the splitters, particularly the splitters toward the input side of the sequence, may need to be adjusted to account for power losses that accumulate after a beam passes through several splitters. Therefore, for the first splitter in a sequence of n−1 splitters, for example, the actual splitting ratio might need to be somewhat less than 1/n. The adjustments to the ratios of subsequent splitters may need to be somewhat less to account for fewer further splits of the portion of the beam that passes through to addition subsequent splitters further down the beam path.

If only approximately equal powered beams are desired, the beam splitter ratios need not be precise. Further, if the number of desired outgoing beams is low, such as for four or fewer resulting beams, then the splitting ratios may not need to be adjusted to account for losses from subsequent splitters.

In accordance with one embodiment, for a pulsed laser input source, the pulse shape and pulse duration can be preserved by using single mode fibers at the input and output connections.

Non-polarizing or polarizing beam splitters can be used to produce the desired polarization characteristics in the output beams. When polarization maintaining fiber and optics are used, the polarization characteristics of a pulsed laser beam can be preserved.

In one application example, a laser beam, which can be a pulsed or continuous wave beam, can be split with the resulting beams being transported in single mode through single mode fibers.

Although the subject matter has been described in terms of certain embodiments, other embodiments, including embodiments which may or may not provide various features and advantages set forth herein will be apparent to those of ordinary skill in the art in view of the foregoing disclosure. The specific embodiments described above are disclosed as examples only, and the scope of the patented subject matter is defined by the claims that follow.

The invention claimed is:

1. A laser beam splitter device comprising:
   a plurality of m input couplers, where m is at least two;
   a sequence of m−1 beam combiners arranged such that a first incoming substantially collimated beam to any combiner in the sequence, except a first combiner, is received from a prior combiner in the sequence and such that the first incoming substantially collimated beam to the first combiner in the sequence is received from a first of the plurality of m input couplers, the combiners further arranged such that a second incoming beam to each combiner in the sequence is received respectively and individually from one of the second through mth input couplers, wherein one of the beam combiners is a polarizing beam splitter;
   a sequence of n−1 beam splitters, where n is at least two, arranged such that an incoming substantially collimated beam to each splitter in the sequence, except a first splitter, is received from a prior splitter in the sequence and such that an incoming substantially collimated beam to the first splitter in the sequence is received from a last of the sequence of beam combiners; and
   a set of n output couplers, each output coupler configured to receive a beam from one of the sequence of n−1 splitters.

2. The laser beam splitter device of claim 1, wherein at least one of the input couplers or at least one of the output couplers is optically connected to an optical fiber.

3. The laser beam splitter device of claim 1, wherein n is at least three.

4. The laser beam splitter device of claim 1, wherein m is two and n is two.

5. The laser beam splitter device of claim 1, wherein at least one of the beam combiners is a dichroic mirror.

6. The laser beam splitter device of claim 5, wherein n is at least three, and wherein each splitter has a respective splitting ratio, with a last splitter in the sequence having a splitting ratio of substantially 1/2 and each successive prior splitter in the sequence having a decreasing splitting ratio determined substantially by successively increasing, by integer increments, a denominator in the splitting ratio starting from 1/2, for each successive splitter, until the first splitter in the sequence has a splitting ratio of 1/n.

7. The laser beam splitter device of claim 1, wherein n is at least three, and wherein each splitter has a respective splitting ratio, with a last splitter in the sequence having a splitting ratio of substantially 1/2 and each successive prior splitter in the sequence having a decreasing splitting ratio determined substantially by successively increasing, by integer increments, a denominator in the splitting ratio starting from 1/2, for each successive splitter, until the first splitter in the sequence has a splitting ratio of 1/n.

* * * * *